US010741402B2

(12) United States Patent
Frank et al.

(10) Patent No.: US 10,741,402 B2
(45) Date of Patent: Aug. 11, 2020

(54) ELECTRONIC DEVICE, ELECTRONIC MODULE AND METHODS FOR FABRICATING THE SAME

(71) Applicant: Infineon Technologies AG, Neubiberg (DE)

(72) Inventors: Paul Frank, Villach (AT); Gretchen Adema, Raleigh, NC (US); Thomas Bertaud, Villach (AT); Michael Ehmann, Villach (AT); Eric Graetz, Klagenfurt (AT); Kamil Karlovsky, Villach (AT); Evelyn Napetschnig, Diex (AT); Werner Robl, Regensburg (DE); Tobias Schmidt, Regenstauf (DE); Joachim Seifert, Schwerte (DE); Frank Wagner, Ruethen (DE); Stefan Woehlert, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/692,495

(22) Filed: Aug. 31, 2017

(65) Prior Publication Data
US 2018/0082848 A1  Mar. 22, 2018

(30) Foreign Application Priority Data
Sep. 21, 2016  (DE) .................. 10 2016 117 826

(51) Int. Cl.
*H01L 23/00* (2006.01)
*H01L 21/285* (2006.01)
*H01L 29/861* (2006.01)

(52) U.S. Cl.
CPC .... *H01L 21/28518* (2013.01); *H01L 21/2855* (2013.01); *H01L 24/03* (2013.01); *H01L 24/29* (2013.01); *H01L 24/32* (2013.01); *H01L 29/861* (2013.01); *H01L 2224/29005* (2013.01); *H01L 2224/29082* (2013.01); *H01L 2224/29083* (2013.01); *H01L 2224/29084* (2013.01); *H01L 2224/29111* (2013.01); *H01L 2224/29147* (2013.01); *H01L 2224/29155* (2013.01); *H01L 2224/32145* (2013.01); *H01L 2224/8309* (2013.01); *H01L 2924/1033* (2013.01); *H01L 2924/10253* (2013.01); *H01L 2924/10271* (2013.01); *H01L 2924/10272* (2013.01);

(Continued)

(58) Field of Classification Search
CPC ............ H01L 21/4857; H01L 21/4846; H01L 24/18–25; H01L 24/08; H01L 24/26–33
See application file for complete search history.

(56) References Cited

U.S. PATENT DOCUMENTS 5,417,827 A  5/1995  Finley
6,610,595 B2  8/2003  Seshan
(Continued)

FOREIGN PATENT DOCUMENTS

DE  26 42 721 A1  4/1978

*Primary Examiner* — Hoa B Trinh
(74) *Attorney, Agent, or Firm* — Dicke, Billig & Czaja, PLLC

(57) ABSTRACT

An electronic device, an electronic module comprising the electronic device and methods for fabricating the same are disclosed. In one example, the electronic device includes a semiconductor substrate and a metal stack disposed on the semiconductor substrate, wherein the metal stack comprises a first layer, wherein the first layer comprises NiSi.

13 Claims, 4 Drawing Sheets

(52) U.S. Cl.
CPC ............ *H01L 2924/10329* (2013.01); *H01L 2924/12032* (2013.01); *H01L 2924/13055* (2013.01); *H01L 2924/13091* (2013.01); *H01L 2924/1461* (2013.01); *H01L 2924/3511* (2013.01)

(56) References Cited

U.S. PATENT DOCUMENTS

| | | |
|---|---|---|
| 8,835,219 B2 | 9/2014 | Mahler et al. |
| 2005/0202673 A1 | 9/2005 | Chi et al. |
| 2006/0202352 A1* | 9/2006 | Li .................... C23C 14/165 257/779 |
| 2008/0203571 A1 | 8/2008 | Jungnickel et al. |
| 2011/0074031 A1 | 3/2011 | Zenner et al. |
| 2012/0098135 A1 | 4/2012 | Badala' et al. |
| 2012/0256306 A1* | 10/2012 | Yu .................... H01L 23/3107 257/676 |
| 2013/0140685 A1* | 6/2013 | Heinrich ........... H01L 23/49582 257/666 |
| 2014/0117533 A1 | 5/2014 | Lei et al. |

\* cited by examiner

US 10,741,402 B2

ELECTRONIC DEVICE, ELECTRONIC MODULE AND METHODS FOR FABRICATING THE SAME

CROSS-REFERENCE TO RELATED APPLICATION

This Utility Patent Application claims priority to German Patent Application No. 10 2016 117 826.8, filed Sep. 21, 2016, which is incorporated herein by reference.

TECHNICAL FIELD

The invention relates to an electronic device, an electronic module and methods for fabricating the same.

BACKGROUND

Manufacturers of electronic devices constantly strive to increase performance of their products, while decreasing their cost of manufacture. A cost intensive area in the manufacture of electronic devices or electronic modules is the preparation of metal stacks arranged on a surface of a semiconductor substrate. A BackSide Metallization (BSM) may be an example of such a metal stack. Such metal stacks may comprise a first layer which reacts with a solder layer when soldering the semiconductor substrate to a carrier. Improvements in such metal stacks, for example improvements in the first layer, as well as improved soldering methods may help to reduce fabrication costs, improve the reliability of solder joints and reduce wafer bow and chip bow. For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
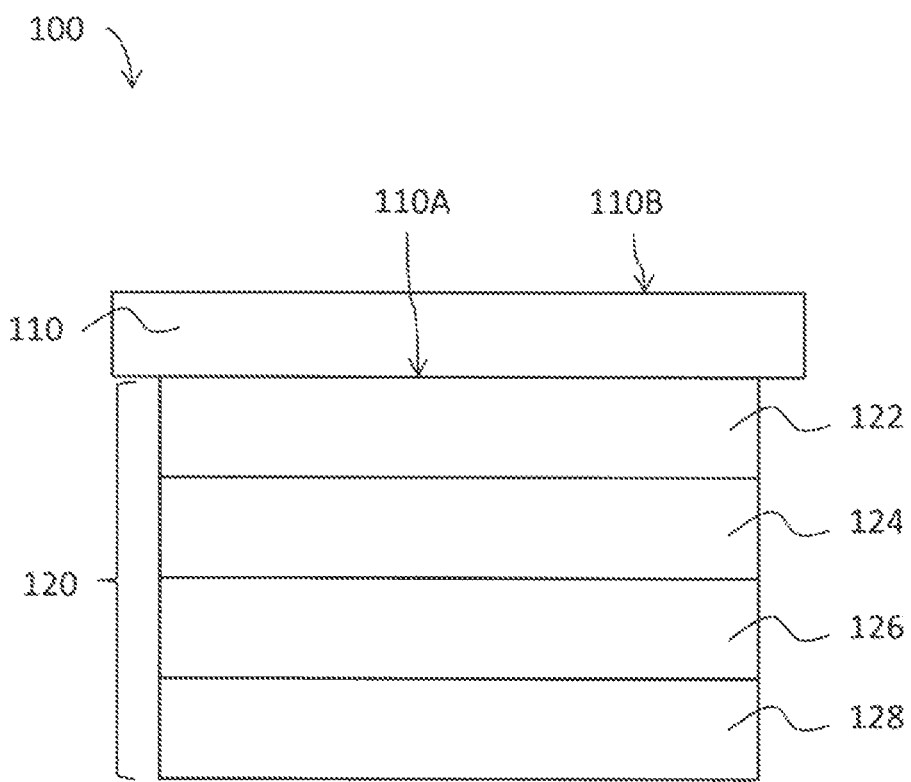
FIG. 1 schematically shows a cross-sectional view of an example of an electronic device according to the invention.

In the following detailed description, reference is made to the accompanying drawings, which form a part thereof, and in which is shown by way of illustration specific embodiments in which the invention may be practiced. It may be evident, however, to one skilled in the art that one or more aspects of the embodiments may be practiced with a lesser degree of the specific details. In other instances, known structures and elements are shown in schematic form in order to facilitate describing one or more aspects of the embodiments. In this regard, directional terminology, such as "top", "bottom", "left", "right", "upper", "lower" etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention.

In addition, while a particular feature or aspect of an embodiment may be disclosed with respect to only one of several implementations, such feature or aspect may be combined with one or more other features or aspects of the other implementations as may be desired and advantageous for any given or particular application, unless specifically noted otherwise or unless technically restricted. The terms "coupled" and "connected", along with derivatives thereof may be used. It should be understood that these terms may be used to indicate that two elements co-operate or interact with each other regardless whether they are in direct physical or electrical contact, or they are not in direct contact with each other; intervening elements or layers may be provided between the "bonded", "attached", or "connected" elements.

The semiconductor substrates or semiconductor chips described further below may be of different types and may be manufactured by different technologies. The embodiments of an electronic device and an electronic module and a method for fabricating an electronic device and an electronic module may use various types of semiconductor chips or circuits incorporated in the semiconductor chips, among them AC/DC or DC/DC converter circuits, power MOS transistors, power Schottky diodes, JFETs (Junction Gate Field Effect Transistors), power bipolar transistors, logic integrated circuits, analogue integrated circuits, mixed signal integrated circuits, sensor circuits, MEMS (Micro-Electro-Mechanical-Systems), power integrated circuits, chips with integrated passives, etc. The embodiments may also use semiconductor chips comprising MOS transistor structures or vertical transistor structures like, for example, IGBT (Insulated Gate Bipolar Transistor) structures, diodes, or, in general, transistor structures in which at least one electrical contact pad is arranged on a first main face of the semiconductor chip and at least one other electrical contact pad is arranged on a second main face of the semiconductor chip opposite to the first main face of the semiconductor chip. Moreover, the embodiments of insulation materials may, for example, be used for providing insulation layers in various types of enclosures and insulation for electrical circuits and components, and/or for providing insulation layers in various types of semiconductor chips or circuits incorporated in semiconductor chips, including the above mentioned semiconductor chips and circuits.

The semiconductor substrates or semiconductor chips considered herein may be thin. The semiconductor substrates or semiconductor chips can be manufactured from specific semiconductor material, for example Si, SiC, SiGe, GaAs, GaN, or from any other semiconductor material, and, furthermore, may contain one or more of inorganic and organic materials that are not semiconductors, such as for example insulators, plastics or metals.

The semiconductor substrates or chips may have contact pads (or electrodes) which allow electrical contact to be made with the integrated circuits included in the semiconductor substrates or chips. The electrodes may be arranged all at only one main face of the semiconductor substrates or chips or at both main faces. They may include one or more electrode metal layers which are applied to the semiconductor material The electrode metal layers may be manufactured with any desired geometric shape and any desired material composition. For example, they may comprise or be made of a material selected of the group of Cu, Ni, NiSn, Au, Ag, Pt, Pd, an alloy of one or more of these metals, an electrically conducting organic material, or an electrically conducting semiconductor material.

The semiconductor substrates or chips may be bonded to a carrier. The carrier may be a (permanent) device carrier used for packaging. The carrier may comprise or consist of any sort of material as, for example, ceramic or metallic material, copper or copper alloy or iron/nickel alloy. The carrier may comprise a power electronic substrate, a leadframe, a DCB (Direct Copper Bond), a DAB (Direct Aluminum Bond), an AMB (Active Metal Braze) substrate, an IMS (Insulated Metal Substrate) or a PCB (Printed Circuit Board). The carrier can be connected mechanically and electrically with one contact element of the semiconductor substrates or chips. The semiconductor substrates or chips can be connected to the carrier by soldering, for example, by one or more of reflow soldering, vacuum soldering, and diffusion soldering. If diffusion soldering is used as the connection technology between the semiconductor substrates or semiconductor chips and the carrier, solder materials can be used which result in intermetallic phases at the interface between the semiconductor and the carrier due to interface diffusion processes after the soldering process. A soft solder material or, in particular, a solder material capable of forming diffusion solder bonds may be used, for example a solder material comprising one or more metal materials selected from the group of Sn, SnAg, SnAu, SnCu, In, InAg, InCu and InAu. The solder material may comprise Pb, or a Pb-free solder material may be used.

The electronic modules may comprise an encapsulation material covering the semiconductor chip(s). The encapsulation material may be electrically insulating. The encapsulation material may comprise or be made of any appropriate plastic or polymer material such as, e.g., a silicon gel, a duroplastic, thermoplastic or thermosetting material or laminate (prepreg), and may e.g. contain filler materials. Various techniques may be employed to encapsulate the semiconductor chip(s) with the encapsulation material, for example compression molding, injection molding, powder molding, liquid molding or lamination. Heat and/or pressure may be used to apply the encapsulation material.

In several embodiments layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

In the following examples of an electronic device comprising a metal stack disposed on a semiconductor substrate or a semiconductor chip are disclosed. The metal stack may be disposed on a backside of the semiconductor substrate. The metal stack may be disposed on a chip pad of the semiconductor substrate and may be configured to provide an electrical connection between the chip pad and a carrier to which the semiconductor substrate is attached to. The metal stack may comprise one single metal layer or it may comprise several metal layers, for example two layers, three layers, four layers or more than four layers. The metal stack may have any suitable size or form. The metal stack may completely cover a surface of the semiconductor substrate or it may cover the surface only partially.

The metal stack may comprise a first layer configured to function as a reaction partner for a solder deposit during soldering. The first layer may comprise a nickel silicon (NiSi) composition and may in particular consist of NiSi. NiSi may exhibit superior properties as a first layer compared to other materials like for example pure nickel, or a nickel vanadium (NiV) composition. For example, NiSi may react slower with Sn during soldering compared to Ni or NiV. In particular, about two times more NiV than NiSi may be used up if the same solder process is carried out. Therefore, thinner layer(s) of NiSi may be used in a metal stack compared to NiV. This may reduce the fabrication time and cost of the metal stack and may also minimize wafer bow or chip bow caused by the difference in the Coefficient of Thermal Expansion (CTE) of the semiconductor substrate and the metal stack.

The first layer may be fabricated using various deposition techniques known in the art. For example, the first layer may be fabricated using magnetron sputtering. Unlike pure Ni, NiSi is not ferromagnetic and therefore does not interfere with the magnetron of a deposition chamber.

Magnetron sputtering may be performed in the presence of a process gas. The process gas may comprise a noble gas, for example Ar, Xe, Kr or Ne. According to one aspect of the invention the process gas may comprise N (nitrogen). The process gas may for example comprise N in the amount of about 5%, 10%, 20%, 30%, 40%, 50%, 60%, 70%, 80% or even more than 80%. The remainder of the process gas may be made up by Ar. The presence of N in the process gas during magnetron sputtering may cause N impurities to be incorporated into the metal stack. For example, N impurities may be incorporated into the first layer. N may be incorporated into a first layer comprising NiSi such that one or more of NiN and SiN is formed in the first layer. N may positively affect the performance of the metal stack, for example the quality of a solder joint between the metal stack and a carrier.

FIG. 1 shows an example of an electronic device 100 according to a first aspect of the invention. The electronic device 100 comprises a semiconductor substrate 110 and a metal stack 120 disposed on a first surface 110A of the semiconductor substrate. The semiconductor substrate 110 may comprise a semiconductor wafer or a single semiconductor chip. The first surface 110A may be a backside of the semiconductor substrate 110. The semiconductor substrate may comprise a chip pad (not shown) arranged on the first surface 110A and the metal stack 120 may be disposed on and electrically connected to the chip pad.

The metal stack 120 may completely cover the first surface 110A or it may only partially cover the first surface 110A as shown in FIG. 1. The metal stack 120 may have any appropriate shape and any appropriate dimension laterally or vertically with respect to the first surface 110A. The metal stack 120 may be structured or unstructured. The metal stack 120 may comprise N impurities as described above.

The metal stack 120 may comprise a first layer 126, wherein the first layer 126 comprises or consists of NiSi. The first layer 126 may have any appropriate thickness depending on the respective requirements on the first layer 126, wherein thickness is measured along a direction perpendicular to the first surface 110A. The first layer 126 may have a thickness in the range of 50 nm to 2000 nm, in particular 100 nm to 1000 nm, more in particular 200 nm to 600 nm and even more in particular 400 nm to 500 nm. The thickness of the first layer 126 may also be about 300 nm or exactly 300 nm.

The first layer 126 may comprise an amount of Si in the range of 2 wt % (2 weight percent) to 50 wt %, in particular 2 wt % to 20 wt %, more in particular 3 wt % to 10 wt %, more in particular 4 wt % to 5 wt % and even more in particular about 4.5 wt % or exactly 4.5 wt % of the total amount of material of the first layer 126.

The metal stack 120 may comprise additional layers apart from the first layer 126. For example, the metal stack may comprise a third layer 128 disposed on the first layer 126. The third layer 128 may be configured to protect the first layer 126 from corrosion. The third layer may comprise or consist of any suitable material or material composition. For example, the third layer may comprise or consist of one or more of Ag, Pt, Pd and Au. The third layer 128 may have any suitable thickness and may for example have a thickness in the range of 50 nm to 2000 nm, in particular 100 nm to 1000 nm, more in particular 150 nm to 500 nm and even more in particular 200 nm to 300 nm. The thickness of the third layer 128 may also be about 200 nm or exactly 200 nm.

The metal stack 120 may comprise a second layer 124, wherein the second layer 124 is arranged between the first layer 126 and the semiconductor substrate 110. The second layer 124 may act as a barrier layer and may prevent the diffusion of impurities into the semiconductor substrate 110. The second layer may have any appropriate thickness, for example a thickness of about or exactly 200 nm. The second layer 124 may comprise any suitable material and may for example comprise or consist of one or more of Ti, WTi, Ta or an alloy comprising at least one of these materials.

The metal stack 120 may comprise a fourth layer 122 arranged between the first layer 126 and the semiconductor substrate 110. In the case that the metal stack 120 comprises a second layer 124, the fourth layer 122 is arranged between the second layer 124 and the semiconductor substrate 110. The fourth layer 122 may have any appropriate thickness, for example a thickness in the range of 50 nm to 2000 nm, in particular 100 nm to 1000 nm, more in particular 200 nm to 600 nm and even more in particular 300 nm to 500 nm. The thickness of the fourth layer 122 may also be about or exactly 400 nm. The fourth layer 122 may comprise any suitable material and may for example comprise or consist of one or more of Al and Ti.

Figure 2:
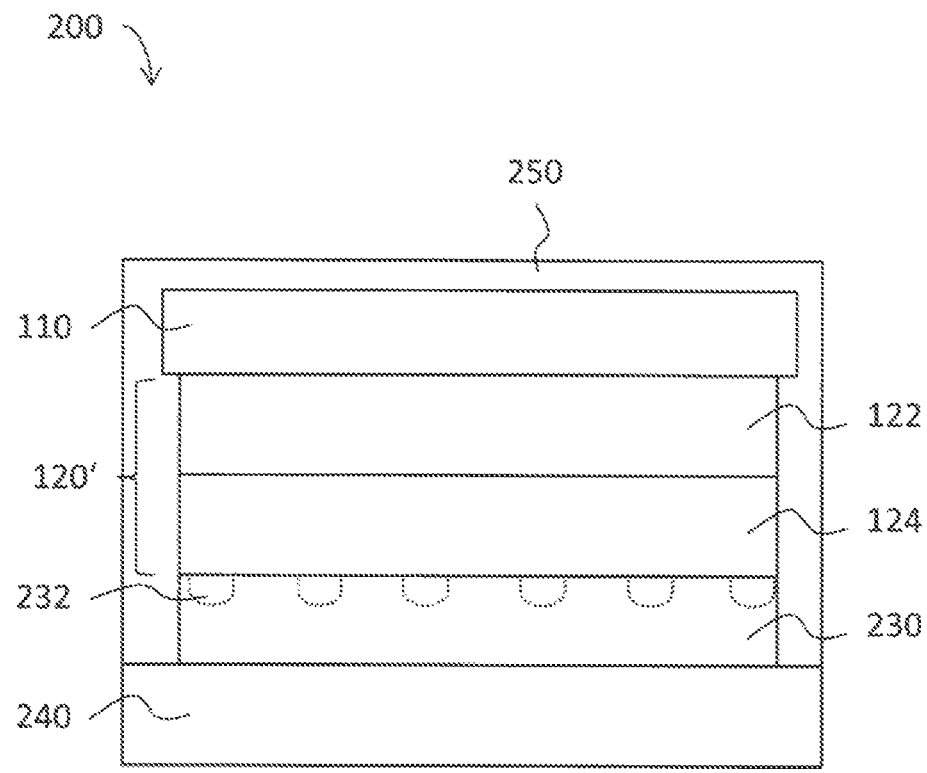
FIG. 2 schematically shows a cross-sectional view of an example of an electronic module according to the invention.

FIG. 2 shows an example of an electronic module 200 according to the invention. The electronic module 100 comprises an electronic device 100 (comprising a semiconductor substrate 110 and a metal stack 120') and a carrier 240 to which the electronic device 100 is attached to. The electronic module 200 may further comprise an encapsulation body 250 encapsulating the semiconductor substrate 110.

The electronic module 200 further comprises a solder layer 230 arranged on the carrier 240 and soldered to the metal stack 120'. The solder layer 230 may for example comprise SnAg or Sn.

The metal stack 120' of the electronic module 200 may be identical to the metal stack 120 of the electronic device 100 of FIG. 1 except for changes introduced by soldering the electronic device 100 to the solder layer 230. According to an example of an electronic module 200 the first layer 126 may be thinner after soldering than before soldering. The first layer 126 may for example be one quarter thinner, one half thinner, three quarters thinner or there may even be no first layer in the metal stack 120' after soldering. The first layer may also be almost completely consumed by the soldering process except for some patches 232 comprising NiSi which may remain in the metal stack 120' after soldering. The patches 232 may be located along an interface between the first layer and the solder layer. The patches 232 may comprise a higher concentration of Si than the precursor first layer 126 because Ni may be "drawn out" during soldering. For example, in the case that the first layer 126 comprised 4.5% Si, the patches 232 may comprise about four times more Si or in other words about 20% Si.

According to an example of an electronic module 200 the metal stack 120' may comprise intermetallic phases formed between the first layer 126 and the solder layer 230.

According to an example of an electronic device 200 the metal stack 120' may comprise N impurities. N may improve the quality of the solder joint formed between the metal stack 120' and the solder layer 230. For example, in the case that the first layer 126 is completely used up by the soldering process the electronic module 200 does not show delamination issues, wherein the metal stack 120' delaminates from the solder layer 230 because N in the metal stack 120' may counteract delamination. In the case that the metal stack 120' comprises the patches 232, the patches 232 may comprise N, for example in the form of one or more of NiN and SiN.

The semiconductor substrate 110 of the electronic module 200 may comprise a first electrode on the first surface 110A and a second electrode on the second surface 110B opposite to the first surface 110A. The electronic module 200 may be configured for an electrical current flowing vertically from the second electrode to the first electrode and further through the metal stack 120' to the carrier 240.

The electronic module 200 shown in FIG. 2 only shows one semiconductor substrate 110, one metal stack 120' and one carrier 240. However, different examples of the electronic module 200 may of course comprise additional components like additional semiconductor substrates, additional metal stacks or additional carriers or other suitable additional components. The additional components may be arranged side-by-side and/or vertically stacked with respect to the components shown in FIG. 2.

Figure 3:
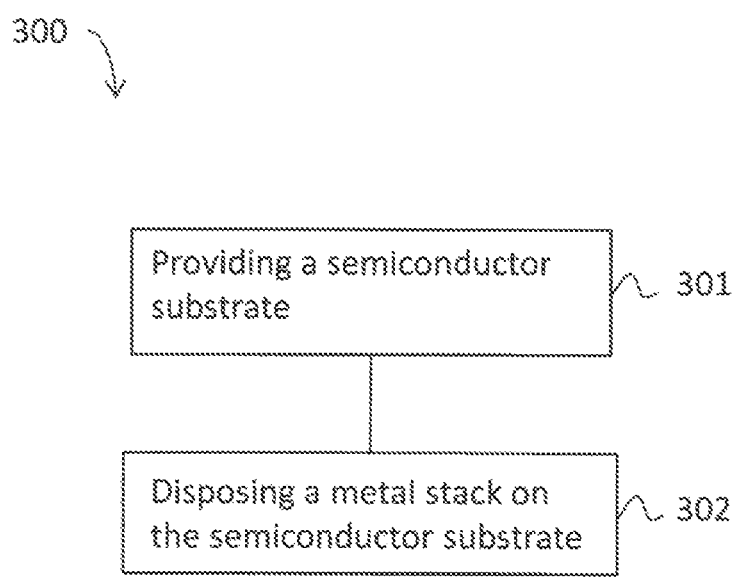
FIG. 3 shows a flow diagram of a method for fabricating an electronic device according to the invention.

FIG. 3 shows a method 300 for fabricating an electronic device like the electronic device 100 of FIG. 1. The method 300 comprises a first process step 301, wherein the first process step 301 comprises the providing of a semiconductor substrate like the semiconductor substrate 110. The method 300 further comprises a second process step 302, wherein the second process step 302 comprises the disposing of a metal stack like the metal stack 120 on the semiconductor substrate.

The disposing of the metal stack in the second process step 302 may comprise a sputtering of a first layer onto the semiconductor substrate. Sputtering may be performed in the presence of a process gas comprising N as described above.

The disposing of the metal stack in the second process step 302 may further comprise an incorporation of N impurities into the metal stack as described above.

Figure 4:
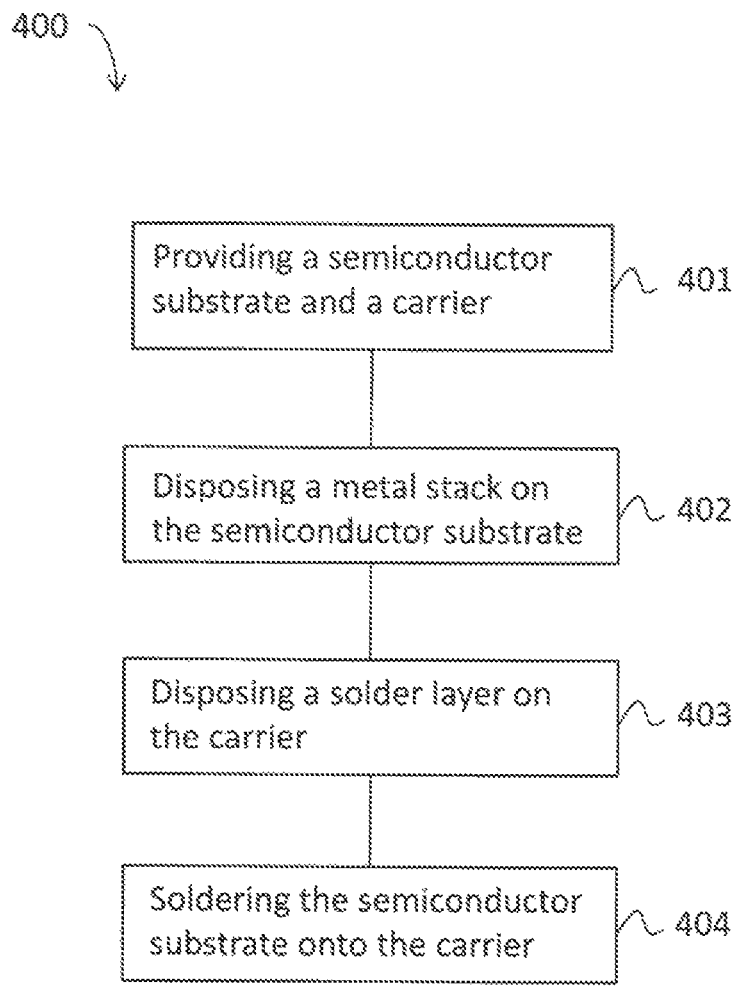
FIG. 4 shows a flow diagram of a method for fabricating an electronic module according to the invention.

FIG. 4 shows a method 400 for fabricating an electronic module like the electronic module 200 of FIG. 2. The method 400 comprises a first process step 401, wherein the first process step 401 comprises the providing of a semiconductor substrate and a carrier. The method 400 comprises a second process step 402, wherein the second process step 402 comprises the disposing of a metal stack on the semiconductor substrate. The method 400 comprises a third process step 403, wherein the third process step 403 comprises the disposing of a solder layer on the carrier. The method 400 comprises a fourth process step 404, wherein the fourth process step 404 comprises soldering the semiconductor substrate onto the carrier.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

The invention claimed is:

1. An electronic device, comprising:
   a semiconductor substrate; and
   a metal stack that completely covers a backside of the semiconductor substrate, the metal stack comprising:
      a first layer;
   wherein the first layer comprises NiSi; and
   wherein the metal stack comprises N impurities in the first layer, in the form of one or more of NiN and SiN.

2. The electronic device according to claim 1, wherein the first layer has a thickness in the range of 50 nm to 2000 nm.

3. The electronic device according to claim 1, wherein the first layer comprises an amount of Si in the range of 2 wt % to 50 wt %.

4. An electronic module, comprising:
   a carrier;
   a semiconductor chip disposed on the carrier;
   a metal stack that completely covers a backside of the semiconductor chip, the metal stack disposed between the carrier and the semiconductor chip, the metal stack comprising:
      a first layer comprising NiSi, and
      a solder layer disposed on the first layer;
   an encapsulation body encapsulating the semiconductor chip and the metal stack disposed between the carrier and the semiconductor chip; and
   wherein the metal stack comprises N impurities.

5. The electronic module according to claim 4, wherein the solder layer comprises a Pb-based or a Pb-free solder.

6. The electronic module according to claim 5, wherein the solder layer comprises Sn or SnAg.

7. The electronic module according to claim 4, wherein the carrier comprises a power electronic substrate, a leadframe, a DCB, a DAB, an AMB, an IMS or a PCB.

8. The electronic module according to claim 4, wherein N impurities are located along an interface between the first layer and the solder layer.

9. A method for fabricating an electronic module, comprising:
   providing a carrier and a semiconductor substrate;
   disposing a first layer on a backside of the semiconductor substrate, wherein the first layer completely covers the backside of the semiconductor substrate;
   disposing a solder layer between the first layer and the carrier; and
   soldering the semiconductor substrate onto the carrier,
   wherein the first layer comprises NiSi, and
   wherein disposing the first layer on the semiconductor substrate comprises sputtering in the presence of a process gas.

10. The method according to claim 9, wherein sputtering comprises a magnetron sputtering process.

11. The method according to claim 9, wherein the process gas comprises N, and wherein the amount of N in the process gas is about 80%.

12. The method according to claim 9, wherein the process gas further comprises Ar, Xe, Kr or Ne.

13. The method according to claim 9 comprising forming intermetallic phases between the first layer and the solder layer.

* * * * *